(12) United States Patent
Li (10) Patent No.: US 6,901,086 B2
(45) Date of Patent: May 31, 2005

(54) STACK-TYPE DIODE LASER DEVICE (76) Inventor: Chian Chiu Li, 1034 W. Iowa Ave. #3, Sunnyvale, CA (US) 94086

( * ) Notice: Subject to any disclaimer, the term of this patent is extended or adjusted under 35 U.S.C. 154(b) by 70 days.

(21) Appl. No.: 10/285,022

(22) Filed: Oct. 30, 2002

(65) Prior Publication Data
US 2004/0086009 A1 May 6, 2004

(51) Int. Cl.[7] .............................. H01S 3/10; H01S 5/00; H01S 3/00
(52) U.S. Cl. ............................... 372/7; 372/20; 372/23; 372/43
(58) Field of Search ............................... 372/20, 43, 7, 372/50, 23, 68, 97

(56) References Cited

U.S. PATENT DOCUMENTS

| 4,280,108 A | 7/1981 | Scifres et al. |
| 4,860,298 A | 8/1989 | Botez et al. |
| 4,901,325 A | 2/1990 | Kato et al. |
| 5,086,431 A | 2/1992 | Hardy, Jr. et al. |
| 5,638,391 A | 6/1997 | Shima et al. |
| 5,802,088 A | 9/1998 | Otsuka et al. |
| 6,167,072 A | 12/2000 | Zory, Jr. |
| 6,212,216 B1 | 4/2001 | Pillai |
| 6,657,775 B1 * | 12/2003 | Farmer et al. ................ 372/20 |

OTHER PUBLICATIONS

Peter Heywood, Article Title : "Tune In!" Apr. 19, 2000, www.lightreading.com.

* cited by examiner

Primary Examiner—Don Wong
Assistant Examiner—James Menefee (57) ABSTRACT

Two thin-clad laser diodes are disposed to form a stack-type device that emits two beams. The beams are substantially parallel and in proximity such that they share many fiberoptic systems designed for a single beam. In one embodiment the device functions as a dual-wavelength fiber-pigtailed light source. In another embodiment a feedback mechanism is provided to couple the diodes. Other embodiments include structures and methods for output power enhancement and tunable lasers.

20 Claims, 8 Drawing Sheets

STACK-TYPE DIODE LASER DEVICE

FEDERALLY SPONSORED RESEARCH

Not applicable

SEQUENCE LISTING OR PROGRAM

Not applicable

BACKGROUND—FIELD OF INVENTION

This invention relates to semiconductor lasers, and particularly to stack-type semiconductor laser devices.

BACKGROUND—DESCRIPTION OF PRIOR ART

As used here, the term "semiconductor laser" or "diode laser" means edge-emitting diode lasers. Edge-emitting diode lasers have a horizontal cavity and emit light beams in a direction parallel to the wafer's plane or an active region of the wafer. Most semiconductor lasers in use are edge-emitting and are used for laser printers, fiberoptic telecommunication systems, and optical data storage devices.

A diode emits an output light beam with a spatial power distribution. The output of a single transverse mode, or a single mode diode, has a single lobe in its spatial power distribution, while a multimode output diode has multiple lobes. Single-mode diode lasers are desirable in many fields, especially in fiberoptic telecommunications and optical data storage. However one of the weaknesses of single-mode diode lasers is that they have relatively low output power. One approach to circumventing this limitation involves ganging a plurality of laser diodes into an array.

One type of diode array is phase-locked diode array. It couples a plurality of identical laser diodes fabricated on a substrate. It provides relatively high output power. Its fabrication process is difficult and its yield is low.

Scifres et al., in U.S. Pat. No. 4,280,108 (1981), describe another type of diode array, which comprises a plurality of parallel active regions with a junction that is transverse to the active regions. This type of diode array suffers from low power due to transverse carrier injection and leakage.

Another type of diode array comprises stacks of laser bars. Each laser bar contains a plurality of diode lasers. The diode array usually emits multimode output. Pillai, in U.S. Pat. No. 6,212,216 (2001), proposes feedback mechanisms and external optics to couple the diodes. The method is not practical for most fiberoptic telecommunication or optical storage applications due to its complex structure.

Accordingly, all of the above diode array devices suffer from a number of disadvantages, including fabrication difficulties, low output power, and complex structures.

In fiberoptic telecommunications, a conventional diode laser module is a single-diode device and has a single-mode fiber pigtail. The diode has a relatively small wavelength-tuning range. For applications requiring a wavelength beyond the tuning range, usually another diode laser module is added. The two modules are either coupled by a coupler, or connected by an optical switch. Thus the system becomes clumsy and its cost is more than doubled. The cost increase results from the added parts and the additional packaging processes, where the latter cost is much higher in a diode laser assembly. Accordingly, a dual-wavelength dual-module fiber-pigtailed system is clumsy and not cost-effective.

The importance of tunable wavelength diode lasers has grown dramatically in fiberoptic telecommunications in recent years. Tunable lasers have three important specifications, i.e. output power, wavelength-tuning range, and tuning speed. A typical high output power is about 20 milliwatts. A typical wide tuning range is about 40 nanometers. A fast tuning speed is in a range of several nanoseconds. Among various tunable lasers, distributed feedback (DFB) lasers offer high power, but suffer a narrow tuning range and a slow tuning speed. Three-section distributed Bragg reflector (DBR) lasers have a fast tuning speed and moderate power, but a narrow tuning range. Sampled grating DBR (SG-DBR) lasers and superstructure grating DBR (SSG-DBR) lasers have a wide tuning range and a fast tuning speed, but low output power. Conventional tunable external cavity diode lasers benefit from high power and a wide tuning range, but suffer a slow tuning speed.

Accordingly, the above tunable lasers can't satisfy the three specifications: high power, wide tuning range, and fast tuning speed.

A stack-type diode device usually comprises two diodes. In the past, Kato et al., in U.S. Pat. No. 4,901,325 (1990), Hardy, Jr. et al., in U.S. Pat. No. 5,086,431 (1992), Shima et al., in U.S. Pat. No. 5,638,391 (1997), and Otsuka et al., in U.S. Pat. No. 5,802,088 (1998), proposed different structures of stack-type diode devices. However these diodes are regular thick-clad diodes. Usually a diode comprises a substrate, an active region, and a top surface with a metal contact layer as a top electrode. The thickness between the active region and the top electrode is usually about two microns for a thick-clad diode. When two thick-clad diodes are stacked in proximity with top surfaces opposite or facing each other, the separation between the two active regions is around four microns. Since a light-emitting spot is usually centered on the active region, with alignment the diodes produce two parallel output beams separated by about four microns. A single output beam has a coupling loss when coupled to a single-mode fiber directly or by a focus lens. If two output beams are coupled to the single-mode fiber, each beam is intentionally misaligned a bit and bears additional coupling loss besides the original one. When a focus lens is used to magnify the beam mode size, the original coupling loss is reduced, but the additional coupling loss is increased.

In a 1.55-micron wavelength device for example, two parallel beams with a four-micron separation have about one dB additional loss. Besides the additional coupling loss, stability of coupled power becomes an issue due to the steep curve of coupling loss versus fiber position deviation. For wavelengths shorter than 1.55 microns, coupling loss issues become even worse.

Accordingly, the above stack-type diode devices generate two output beams which are too far apart. They can't share a fiberoptic system designed for a single diode.

On the other hand, a thin-clad diode design, as Zory, Jr. teaches in U.S. Pat. No. 6,167,072 (2000), makes the thickness much smaller than usual between the active region and the top surface. Instead of two microns, the thickness can be a few tenths of a micron.

OBJECTS AND ADVANTAGES

Accordingly, several main objects and advantages of the present invention are:

(a). to provide an improved stack-type diode laser device;
(b). to provide such a device which emits two output beams that are substantially close and parallel;

(c). to provide such a device which has a simple structure and generates higher output power than that obtainable from a single laser diode;

(d). to provide such a device as a dual-wavelength fiber-pigtailed source which is compact and cost-effective;

(e). to provide such a device as a tunable laser which has high power, a wide tuning range, and a fast tuning speed.

Further objects and advantages will become apparent from a consideration of the drawings and ensuing description.

SUMMARY

In accordance with the present invention, two thin-clad diodes are stacked together with the top surfaces opposite each other. The separation between the two light-emitting spots can be smaller than one micron. Thus the two output beams can be parallel with a separation smaller than one micron. In a 1.55-micron wavelength device for example, the additional coupling loss is about 0.2 dB when two parallel beams with a one-micron separation are coupled to a single-mode fiber by using a focus lens. Stability of coupled power is also improved greatly when compared with that at a four-micron separation.

Therefore a stack-type thin-clad diode device is able to generate two substantially close and parallel output beams. It enables the two diodes to share fiberoptic systems designed for a single diode without additional coupling and combining optics. It also creates new ways to couple two laser diodes of same or different types, which in turn generates new mechanisms to achieve high power, dual-wavelengths, or wavelength tunability.

ABBREVIATIONS

AR Antireflection
DBR Distributed Bragg reflector
DFB Distributed feedback
FBG Fiber Bragg grating
HR High reflection
LED Light-emitting diode
PR Partial reflection
SG Sampled grating
SSG Superstructure grating
SG-DBR Sampled grating-distributed Bragg reflector
SSG-DBR Superstructure grating-distributed Bragg reflector

DRAWING FIGURES

FIG. 1-A is a schematic cross-sectional view of a typical prior-art ridge-guide laser diode.

FIG. 1-B is a schematic perspective view of a typical prior-art ridge-guide laser diode.

FIG. 2-A is a schematic cross-sectional view of a stack-type diode laser device according to the invention.

FIGS. 2-B, 2-C, 2-D, and 2-E are schematic cross-sectional views illustrating embodiments of the device of FIG. 2-A with alternative bonding and supporting structures according to the invention.

FIG. 4-A is a schematic diagram of a stack-type diode laser device comprising a waveguide and a feedback mechanism according to the invention.

FIG. 4-B is a schematic diagram of a stack-type diode laser device comprising two DBR diodes, a waveguide, and a feedback mechanism according to the invention.

FIG. 4-C is a schematic diagram of a stack-type diode laser device comprising a DBR diode, a gain chip, a waveguide, and a feedback mechanism according to the invention.

FIG. 4-D is a schematic diagram of a stack-type diode laser device comprising an optical fiber and a feedback mechanism according to the invention.

FIG. 4-E is a schematic diagram of a stack-type diode laser device comprising a waveguide and a feedback mechanism according to the invention.

FIG. 4-F is a schematic diagram of a stack-type diode laser device comprising two DBR diodes, a waveguide, and a feedback mechanism according to the invention.

FIGS. 5-A and 5-B are schematic diagrams illustrating embodiments of tunable external cavity diode lasers according to the invention.

REFERENCE NUMERALS IN DRAWINGS

| | | | |
|---|---|---|---|
| 6 | HR Bragg reflector section (2) | 8 | Phase section (2) |
| 9 | gain section (2) | 10 | active region |
| 11 | insulating bonding materials | 12 | p-cladding layer |
| 14 | n-cladding layer | 15 | insulator region |
| 16 | contact layer | 17 | conductive bonding materials |
| 18 | metal contact layer | 19 | conductive filling materials |
| 20 | n-type substrate | 21 | bench |
| 22 | light-emitting spot | 23 | diode submount |
| 24 | diode with center ridge (1) | 25 | wire |
| 26 | diode with center ridge (2) | 27 | gap |
| 28 | focus lens | 30 | AR coating on waveguide |
| 32 | PR coating on waveguide | 33 | HR coating on waveguide |
| 34 | single-mode fiber | 35 | diode with off-center ridge (1) |
| 37 | diode with off-center ridge (2) | 38 | fiber Bragg grating (FBG) |
| 40 | AR coating on facet | | |
| 42 | HR coating onfacet | 44 | waveguide |
| 46 | collimating lens | 48 | tuning element (1) |
| 49 | front facet | 50 | rear facet |
| 52 | gain chip (1) | 54 | gain chip (2) |
| 56 | HR Bragg reflector section (1) | 57 | PR reflector section (1) |
| 58 | gain section (1) | 60 | phase section (1) |
| 61 | thin-clad diode (1) | 62 | DBR diode (1) |
| 63 | thin-clad diode (2) | 64 | DBR diode (2) |
| 65 | fiber's input aperture surface | 66 | output beam (1) |
| 68 | output beam (2) | 70 | AR coating on fiber aperture |
| 72 | DBR diode (3) | 74 | thin-clad diode (3) |

Figure 1:
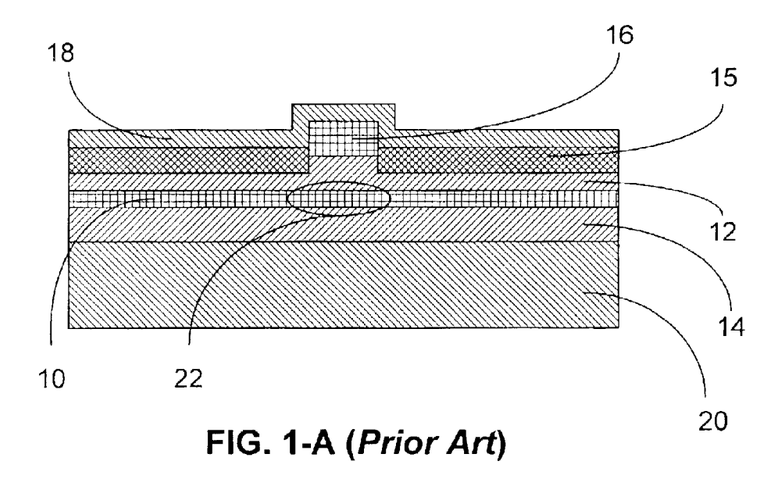

DETAILED DESCRIPTION—FIGS 1-A AND 1-B—PRIOR-ART

FIGS. 1-A and 1-B show a schematic cross-sectional and a perspective view of a typical prior-art ridge-guide laser diode. The diode is fabricated on an n-type substrate 20, which usually is a thin square or rectangular semiconductor chip with a thickness around one hundred microns. Deposited on substrate 20 are an n-type cladding layer 14, an active region 10 of the diode, a p-type cladding layer 12, a p-type contact layer 16, two insulator regions 15, and a metal contact layer 18 as a top electrode. The diode emits light beams from an elliptical region 22 on the edge or side of the diode.

As shown in the figures, a protruded ridge is formed by etching layer 16 and part of layer 12 in the center portion of the chip. A top surface region comprises layers 16 and 18. A top surface comprises the upward surface area of the protruded part of layer 18. The layers between active region 10 and the top surface have a total layer thickness of about two microns for a regular thick-clad design. In the case of a thin-clad design, the total layer thickness can be reduced to several tenths of one micron.

Besides the center ridge, a diode can also have an off-center ridge (not shown). For a ridge-guide diode, its layer structure, ridge structure and orientation, and front and rear facets determine its resonant cavity. A diode with an off-center ridge works the same as that with a center ridge, as long as their ridge structures and orientation directions are the same.

Figure 2:
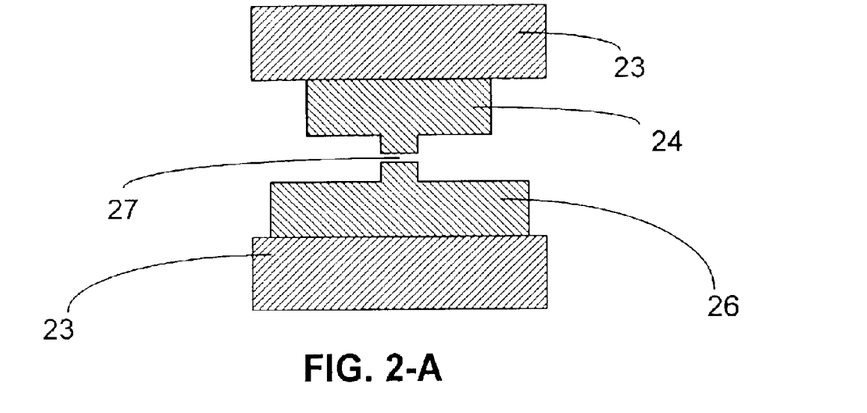

FIGS. 2-A–2-E—Stack-Type Devices and Their Bonding and Supporting Structures

FIG. 2-A shows schematically one embodiment of a stack-type device according to the invention. Thin-clad ridge-guide diodes 24 and 26 have a similar layered structure and a center ridge to that of FIG. 1-A. Diode 26 is wider than diode 24 in order to enable bonding. They are disposed with their top surfaces opposite each other and in proximity. The two diodes are aligned such that their output beams have substantially parallel irradiation directions. Between the diodes is a gap 27. Since the ridge part is not necessarily needed in the bonding process, gap 27 can be empty or contain bonding or filling materials which are either electrically conductive or insulating. The two ridges can also be in physical contact.

The separation between active regions of the diodes in FIG. 2-A is determined by gap 27 and the total layer between the active region and the top surface. As discussed in the description of FIGS. 1-A and 1-B, the distance between the active region and the top electrode can be reduced to about several tenths of one micron in a thin-clad design. The electrode can be made very thin. Gap 27 depends on the relative positions of diodes 24 and 26. When the diodes are close, the gap becomes small. Therefore the two active regions can have a separation smaller than one micron. The output beams of diodes 24 and 26 can be parallel with a separation smaller than one micron.

The diodes in FIG. 2-A can be of same or different types, as long as they have a thin-clad design and generate two beams that are parallel and in proximity.

FIG. 2-B depicts a bonding scheme for the stack-type device of FIG. 2-A. The two diodes are bonded together by bonding material 17. A wire 25 is bonded on the metal contact layer of diode 26. Bonding material 17 is electrically conductive and it connects the top electrodes of the two diodes.

FIG. 2-C depicts a bonding and supporting scheme for the stack-type device of FIG. 2-A. Diodes 24 and 26 are bonded on respective submounts 23. Submounts 23 are bonded on a bench 21. Filling material 19 between the diodes is electrically conductive so that the two diodes have their top electrodes connected. The position of the diodes is determined by the bonding between the diode and the submount, and between the submount and the bench.

The stack-type device can also be constructed by thin-clad diodes that have an off-center ridge. FIG. 2-D shows a bonding scheme for such a device. Diodes 35 and 37 have an off-center ridge and a similar layered structure to that shown in FIG.1-A. Bonding material 11 is electrically insulating. Wires 25 are bonded to top electrodes.

FIG. 2-E shows another bonding and supporting scheme for diodes 35 and 37. The method and structure employed are similar to that in FIG. 2-C.

Figure 3:
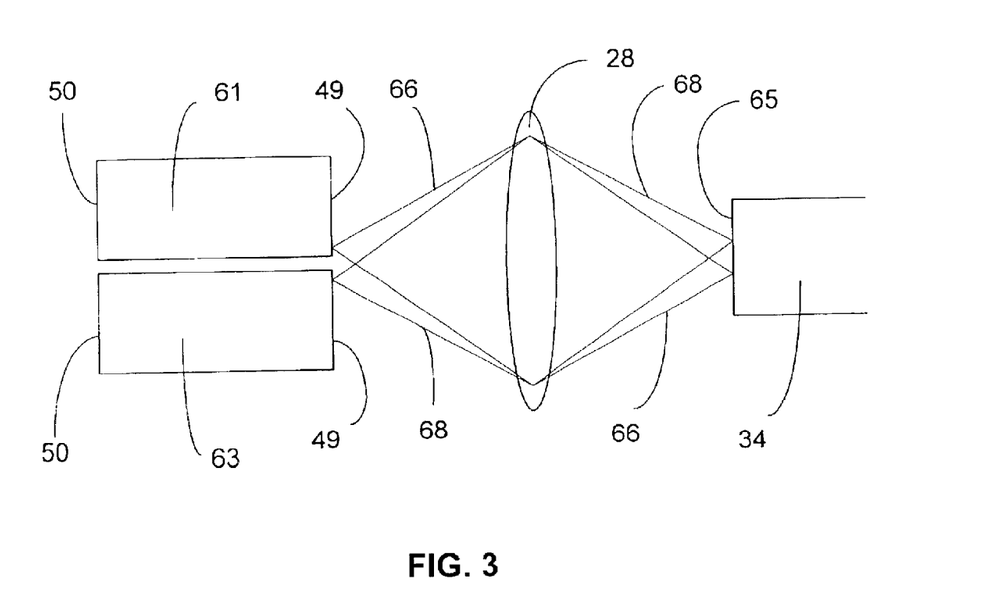
FIG. 3 is a schematic diagram of a stack-type diode laser device comprising a single-mode fiber according to the invention.

FIG. 3—Stack-Type Devices Comprising a Single-Mode Fiber

FIG. 3 illustrates schematically another embodiment comprising a focus lens 28, a single-mode fiber 34, and thin-clad diodes 61 and 63 disposed opposite each other as in FIG. 2-A. Each diode has a front facet 49 and a rear facet 50. Focus lens 28 is disposed in front of front facet 49. Fiber 34 has an input aperture surface 65. Diodes 61 and 63 generate respective output beams 66 and 68. For a diode, a conventional facet coating includes a high reflection (HR) coating on its rear facet and a partial reflection (PR) or an antireflection (AR) coating on its front facet. Such facet coating technology is quite mature.

The operation of a diode is sensitive to feedback. Unwanted feedback comes from components' back reflection and causes instability of output power and wavelength. To reduce feedback, back reflection has to be reduced. As a result, lens 28 and surface 65 are coated with an AR coating. To reduce back reflection further, surface 65 is angled so that the reflected beams are off the original light path and don't contribute to feedback.

Diodes 61 and 63 are disposed and aligned such that beams 66 and 68 are substantially close and parallel. As with the stack-type device of FIG. 2-A, the separation between the two beams can be smaller than one micron. For a 1.55 micron wavelength device, both beams have about 0.2 dB additional coupling loss when coupled to fiber 34. Therefore the two diodes can share a fiberoptic system designed for a single diode, which in turn generates various mechanisms and applications evolving two diodes.

If diodes 61 and 63 have different wavelengths, this embodiment works as a compact dual-wavelength fiber-pigtailed light source. If the two diodes are of the same type and have substantially close wavelengths, they provide a backup scheme. In a backup scheme, only one diode is in operation while the other is reserved as a backup. When the diode in use becomes problematic, it is turned off and the backup diode becomes operational. The backup diode scheme provides a new way to enhance reliability by doubling diode lifetime. Both the dual-wavelength scheme and the backup scheme are also cost-effective since they take advantage of the cost difference between the parts and the packaging process.

In one ramification, a fiber Bragg grating (FBG) (not shown in FIG. 3) is fabricated within segments of fiber 34 at a distance from its input aperture. The FBG is a spectral filter that typically has a narrow reflection band. The FBG causes light waves over a narrow wavelength range to be fed back to the diodes. The narrow band feedback locks an output wavelength within a narrow range. Thus a FBG not only helps create an output of a narrow spectral width, but also improves wavelength accuracy and stability.

For example, a regular Fabry-Perot type laser has an output spectrum of multiple peaks, which is undesirable in fiberoptic telecommunications. A FBG generates a narrow band feedback to select only one of those peaks. As a result, the output spectrum becomes a single peak with a narrow spectral width. A FBG structure determines its feedback intensity and spectrum. Usually only a fraction of light wave energy is needed for the feedback. Since a backup scheme needs a narrow band feedback, a regular FBG design works. For a dual-wavelength scheme, a special FBG structure is needed for feedback of dual narrow bands.

In the embodiment of FIG. 3, all diodes with thin-clad designs, including light-emitting diodes (LEDs) and one-dimensional thin-clad diode arrays, can be used. A LED emits an output with a broad spectral width or a broadband. If two LEDs have similar central wavelengths and broadbands, this embodiment combines their output power. If two LEDs have different central wavelengths, the embodiment combines their spectra to create a broadened spectral width or two broadbands in one spectrum.

For distributed feedback (DFB) lasers, or distributed Bragg reflector (DBR) lasers, the embodiment provides another benefit besides advantages of the backup and dual-wavelength schemes. DFB or DBR lasers emit a beam with a narrow spectral width. They are widely employed as a light source in fiberoptic telecommunications. Their output wavelength is tunable. A DFB laser is thermally tuned by its temperature at a slow tuning speed, typically from microseconds to seconds. A DBR laser is usually tuned by current injection at a fast tuning speed, in a range of several nanoseconds. Both lasers suffer from a short tuning range, which is about several nanometers. The embodiment of FIG. 3 doubles it by combining two tuning ranges.

Diodes 61 and 63 can also be of different types to create new devices. For example, a stack-type device formed by a DFB laser and a LED provides both a narrow spectral width and a broadband output at the same time.

Figure 4:
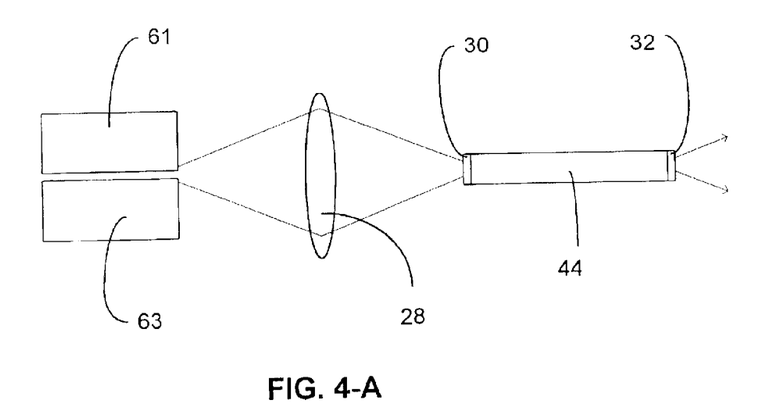

FIG. 4-A—Stack-Type Devices Comprising a Waveguide and Feedback

Another embodiment according to the invention is shown schematically in FIG. 4-A, where diodes 61 and 63 are disposed as in FIG. 2-A, along with a focus lens 28 and a single-mode waveguide 44. Lens 28 is in front of the front facets of the diodes. The two diodes have close working wavelengths, and have HR coatings on their rear facets and AR or PR coatings on their front facets. Waveguide 44 has an AR coating 30 on its input aperture surface and a PR coating 32 on its exit aperture surface. PR coating 32 and the HR coating on the rear diode facet form an external cavity. PR coating 32 should have a broadband reflection spectrum, which can be done by routine coating services.

Power enhancement is the main advantage of the embodiment of FIG. 4-A. The output power of the diodes is combined by employing three techniques: feedback, light path control, and cavity mode control.

First, the diodes are coupled by feedback from waveguide 44. Here waveguide 44 functions as a mode mixer. It mixes modes of light waves from both diodes. PR coating 32 reflects the mode-mixed light waves to create feedback. The same feedback couples the diodes together by injection locking.

Second, the light paths between the input aperture of waveguide 44 and the rear facets of the diodes are optimized. When the output beams of the two coupled diodes reach the input aperture, they have a phase difference. If the light path difference is neither zero nor a multiple of the working wavelength, the output power is reduced due to partial or complete destructive interference. To get constructive interference, round trips of propagation from the input aperture to the rear facets produce either equal light paths, or a light path difference that is a multiple of the working wavelength. The light path is affected by the diode's position, structure, temperature, dimension, and current injection. Among these, diode temperature and current injection are tunable. In cases of two identical diodes with similar temperatures and current injection, the phase difference is close to zero and the power loss is tolerable.

Third, external cavity modes are adjusted for output power, power stability, and wavelength accuracy and stability. A mode represents a self-reproducing wave in a resonator. If a working wavelength doesn't match any external cavity mode, it causes power loss or power instability. In some cases, it emits a wavelength that matches an external cavity mode but has a deviation from the desired wavelength. Cavity mode control methods tune the cavity modes so that one mode matches the working wavelength. The methods include adjusting the temperature of the waveguide and the diodes, and current injection of the diodes. With a long external cavity, the cavity modes become so dense that any wavelength matches a mode within wavelength accuracy. In such cases cavity mode matching becomes unnecessary.

The above three techniques combine output power of two diodes. The scheme applies to all thin-clad diodes and one-dimensional thin-clad diode arrays.

For example, diodes 61 and 63 in FIG. 4-A can be thin-clad DFB laser diodes. Since DFB lasers have a narrow spectral width, they need to have substantially close working wavelengths such that their output spectra overlap. Otherwise, output power can't be combined in one wavelength. It will contain two wavelengths instead.

The output power is further increased if one diode is a DFB diode and the other is a gain chip with an AR coating on its front facet and a HR coating on its rear facet. A gain chip is a diode whose function is to provide a gain of light wave energy in a wide wavelength range. Gain chips are widely used in tunable external cavity diode lasers. In the DFB hybrid design, the gain chip serves as a broadband optical amplifier and lases at the working wavelength of the DFB diode. A DFB hybrid design requires special consideration on light path matching due to different diode structures. Since a gain chip has high power and is easy to make, a DFB hybrid design generates higher output power at a lower cost than a design of two DFB diodes.

If the two DFB diodes or the DFB diode in a hybrid design are wavelength tunable, it becomes a tunable laser. Its lasing wavelength is determined by the DFB diode. Its narrow tuning range is about several nanometers. Its tuning speed is slow, ranging from microseconds to seconds.

FIGS. 4-B and 4-C—Stack-Type Devices Comprising DBR Diodes and Feedback

When diodes 61 and 63 in FIG. 4-A are replaced by thin-clad three-section DBR laser diodes 62 and 64, we get another embodiment, which is depicted schematically in FIG. 4-B. The three sections include Bragg grating reflector sections 6 and 56, phase sections 8 and 60, and gain sections 9 and 58. AR coatings 40 are deposited on the front and rear facets. Bragg reflector sections 6 and 56 are highly reflective and next to the rear facet. The reflection spectrum can be tuned at a fast speed by a current injection in the reflector section. Its tuning range is about several nanometers. The phase section adjusts the light path and the external cavity mode.

The embodiment in FIG. 4-B also works for two-section DBR laser diodes. A two-section DBR diode, with only two sections (a Bragg reflector section and a gain section), has a lower cost than a three-section one. But a phase section does provide a fast and convenient way to control the light paths and external cavity modes. Stack-type DBR laser devices include all combinations of two-section and three-section DBR diodes.

The embodiment of FIG. 4-B has several applications related to the reflection spectra of reflector sections 56. The applications include power enhancement and novel tunable lasers. There are mainly two types of reflection spectra.

In a first embodiment the reflection spectrum contains a single narrow band. The narrow reflection band helps generate an output having a narrow spectral width. Coupling two DBR diodes with substantially close reflection bands increases the output power while maintaining its narrow spectral width.

The output power is further increased if one is a DBR diode and the other is a gain chip as shown schematically in FIG. 4-C. The stack-type device comprises a three-section DBR diode 62, and a gain chip 52 with a HR coating 42 on its rear facet and an AR coating 40 on its front facet. In the DBR hybrid design, the gain chip serves as a broadband optical amplifier and lases at the working wavelength of the DBR diode. The DBR hybrid design generates higher output power at a lower cost than a design of two DBR diodes.

If the two DBR diodes or the DBR diode in hybrid design are tunable, the stack-type device becomes a tunable DBR diode laser. The Bragg reflector determines the lasing wavelength. Its narrow tuning range is about several nanometers. It has a fast tuning speed in a range of nanoseconds.

In a second embodiment the Bragg reflectors have comb-like reflection spectra.

Returning to FIG. 4-B, Bragg reflectors 6 and 56 now provide a high reflection for two groups of wavelengths. Their reflection spectra look like a comb. The two comb-like spectra have different free spectral ranges, or peak-to-peak spacings. The embodiment works as a tunable external cavity DBR diode laser. Based on the Vernier effect, lasing occurs at a wavelength where two peaks of the two comb-like spectra coincide. Like SG-DBR and SSG-DBR lasers, wavelength tuning is accomplished by tuning the two comb-like spectra so that two peaks coincide at different desired wavelengths. Although the comb-like spectra have a narrow tuning range of several nanometers, their peaks can coincide in a much wider range. The tunable external cavity DBR diode laser has a tuning range of about 40 nanometers. The tuning speed is fast, i.e. the output wavelength can be tuned within its tuning range in several nanoseconds.

Structures to generate a comb-like spectrum include a sampled grating (SG), or a superstructure grating (SSG). SG and SSG reflectors require a complicated fabrication process. They also cause optical losses, especially in a high reflection case. Compared with a SG-DBR tunable laser or a SSG-DBR tunable laser, a tunable external cavity DBR diode laser has a similar wide tuning range, a similar fast tuning speed, but higher output power. The higher power results from one less Bragg reflector and power enhancement nature of the stack-type device. One less Bragg reflector also means higher yields and lower costs than that of SG-DBR and SSG-DBR lasers.

FIG. 4D—Stack-Type Devices Comprising a Single-Mode Fiber and Feedback

FIG. 4-D shows another embodiment according to the invention. Compared with FIG. 4-A, a single-mode fiber 34 replaces waveguide 44, while everything else remains unchanged. Fiber 34 has AR coating 70 on its angled input aperture surface. A FBG 38 is disposed at a distance from the input aperture. The FBG serves as a partial reflector to provide feedback like PR coating 32 does in FIG. 4-A. Since there is a need for a fiber-pigtailed light source in fiberoptic telecommunications, the embodiment in FIG. 4-D represents a compact and economic structure.

For a light source in fiberoptic telecommunications, output power is measured by the light wave energy coupled into a single-mode fiber. Because an optical fiber is a circular waveguide, a circular beam has better coupling efficiency than an elliptical beam. Since edge-emitting diodes generate an elliptical beam, the beam divergence angle is much larger in a direction perpendicular to an active region than that in a direction parallel to it. To improve beam circularity for better coupling efficiency, usually external optics are employed. For a stack-type laser device, two beams are coupled in a direction perpendicular to an active region, thus the divergence angle of the combined beams is reduced in that direction. As a result, the combined beam is less elliptical and more circular, and more output power is coupled into a single-mode fiber.

Further, waveguide 44 can be replaced by a single-mode fiber in all embodiments as long as the characteristics of the feedback and the external cavity remain unchanged.

FIGS. 4-E, 4-F, and 4-A—Stack-Type Devices Comprising Feedback

Another embodiment is illustrated schematically in FIG. 4-E. Here a stack-type device has a similar structure to that of FIG. 4-A with a few exceptions. Here diodes 74 and 76 have PR coatings on the rear facets and AR coatings on the front facets. HR coating 33 is deposited on the exit aperture surface of waveguide 44. The waveguide still has an AR coating 30 on its input aperture surface.

Compared to the embodiment in FIG. 4-A, here the output comes from the rear facets of the diodes instead of the exit aperture of the waveguide. Similar considerations are taken for the light path control and cavity mode control.

FIG. 4-F shows yet another embodiment comprising DBR diodes 72 and 80. Comparing it to FIG. 4-B, there are two changes. PR Bragg reflectors 82 and 57 replace HR Bragg reflectors 6 and 56. A HR coating 33 replaces PR coating 32 on the exit aperture surface of waveguide 44.

For a Bragg reflector used in DBR lasers, it is well known that its reflectivity is related to its optical loss. Higher reflectivity causes a higher loss. A PR Bragg reflector causes much less optical loss than a HR Bragg reflector.

PR Bragg reflectors with a single narrow band or a comb-like reflection spectrum provide similar results to that of the embodiment of FIG. 4-B. The main difference between the embodiments of FIGS. 4-B and 4-F is that the former has a more compact structure and the latter has higher output power. A tunable external cavity DBR diode laser based on the embodiment of FIG. 4-F can generate output power of about 20 milliwatts.

Similar power enhancement results occur in the embodiment of FIG. 4-C when Bragg reflector 56 and coating 42 become partially reflective and coating 32 becomes highly reflective.

The above discussions show that the stack-type diode device provides a tunable external cavity DBR diode laser that has high power, a wide tuning range, and a fast tuning speed.

To enhance performance further, other optical devices, such as a modulator or an amplifier, can be integrated with a diode, especially a DBR diode. The integrated devices share the same substrate with the diode. Output light waves of the diode are coupled into waveguides of the optical devices. To maintain the relative positions of the output beams, the top surfaces of the optical devices should be at about the same level as that of the diode. A preferred integrated modulator section is the electro-absorption type. The monolithic solution is effective to save space, costs, and improve reliability.

Reverting to FIG. 4-A, light path control can also be used as a modulator to modulate output power. By adjusting the light path difference, the light wave energy propagating in the waveguide is modulated by a constructive or destructive interference. For destructive interference, round trips of propagation from the input aperture to the rear facets produce a light path difference that equals half or a multiple and a half of the working wavelength.

Figure 5:
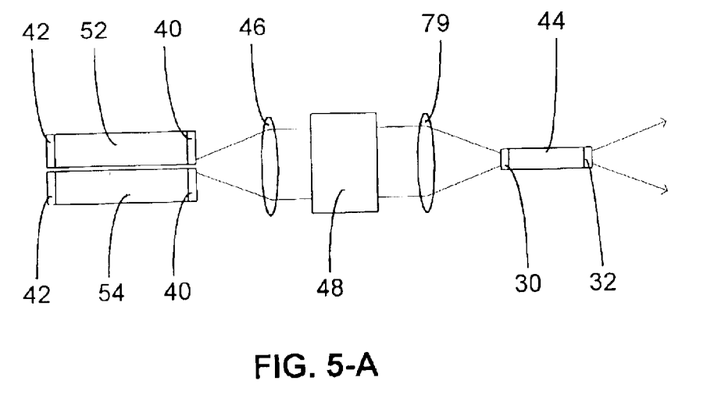

FIGS. 5-A and 5-B—Tunable Extrernal Cavity Diode Lasers

Yet another embodiment is shown in FIG. 5-A, which depicts schematically a tunable external cavity diode laser. The tunable laser comprises two thin-clad gain chips 52 and 54 disposed opposite each other as in the embodiment of FIG. 2-A. The gain chips have HR coatings 42 and AR coatings 40. The other parts include a collimating lens 46, a wavelength-tuning element 48, a beam-focusing lens 79, and a single-mode waveguide 44 with an AR coating 30 on its input aperture surface and a PR coating 32 on its exit aperture surface. HR coating 42 and PR coating 32 define the external cavity. Waveguide 44 generates feedback to couple the two diodes by injection locking.

In this embodiment element 48 has a tunable transmission spectrum, which determines the lasing wavelength. In one ramification of this embodiment, a single-mode fiber replaces cavity 44 while either a PR coating on the exit aperture surface of the fiber, or a partially reflective FBG maintain the feedback.

FIG. 5-B shows yet another embodiment of the tunable external cavity diode laser. Single-mode waveguide 44 has the same structure. Diodes 52 and 54 remain the same except that both facets have AR coatings 40.

In this embodiment, waveguide 44 and a wavelength-tuning element 78 are disposed on the opposite sides of the diodes. Element 78 has a tunable reflection spectrum, which determines the lasing wavelength. The lasing cavity is between PR coating 32 and a highly reflective surface of element 78. The output comes from the exit aperture of waveguide 44.

If element 78 generates a partial reflection with a tunable spectrum, and coating 32 is replace by a HR coating, the output port changes from waveguide 44 to element 78.

Some advantages of using a stack-type diode device in a tunable external cavity diode laser include high output power, which is one of the important factors of a tunable laser.

The same considerations on light path control and cavity mode control should be addressed as discussed for other stack-type diode devices with a feedback structure.

Conclusion, Ramifications, and Scope

Accordingly, the reader will see that the stack-type diode laser devices of this invention can be used to enhance output power of a single-mode laser, to provide a compact dual-wavelength fiber-pigtailed light source, and to provide a tunable laser with high power, a wide tuning range, and a fast tuning speed. In addition, the stack-type diode laser device can be used to provide a backup scheme to enhance device reliability. Furthermore, the spectra of two LEDs or the tuning ranges of two DFB or DBR lasers can be combined for a wider coverage.

Although the description above contains many specificities, these should not be construed as limiting the scope of the invention but as merely providing illustrations of some of the presently preferred embodiments. Numerous modifications, alternations, and variations will be obvious to those skilled in the art. For example, a thin-clad Fabry-Perot laser diode can replace a gain chip in many embodiments, where the Fabry-Perot diode is tuned by its temperature and current injection such that one of its modes matches the working wavelength. Also a DFB laser diode with a comb-like output spectrum can replace a DBR laser with a similar spectrum. The light path control can be omitted in cases where power variation due to a partial destructive interference is small and tolerable. A spectral filter can replace a PR coating on the exit aperture's surface of the waveguide, where the exit aperture's surface has an AR coating and the filter is attached to the AR coating. A stack-type device of two Fabry-Perot laser diodes can make use of the Vernier effect to generate either an output with a narrow spectral width, or a tunable wavelength source like a tunable external cavity DBR diode laser. Lastly a stack-type device can combine a diode working as a light source and a diode working as a pump source to create a compact source-pump module.

Therefore the scope of the invention should be determined by the appended claims and their legal equivalents, rather than by the examples given.

What is claimed is:

1. A semiconductor laser device comprising:
   1) a first semiconductor laser diode arranged to emit an output beam at a predetermined wavelength, said diode including:
      a) a top surface with a top electrode,
      b) a light wave generating substructure including a plurality of semiconductor layers disposed below said top surface,
      c) said light wave generating substructure having an active region within 1.5 -micrometer distance of said top electrode;
   2) a second semiconductor laser diode arranged to emit an output beam at a predetermined wavelength, said diode including:
      a) a top surface with a top electrode,
      b) a light wave generating substructure including a plurality of semiconductor layers disposed below said top surface,
      c) said light wave generating substructure having an active region within 1.5 -micrometer distance of said top electrode; and
   3) bonding and support means for disposing said first and second laser diodes such that their top surfaces are proximate and opposite each other,
   whereby said output beams of said first and second laser diodes are proximate and can be fed into a single-mode fiber directly or through a focus lens with tolerable power loss.

2. The laser device according to claim 1 wherein said first and second laser diodes are disposed such that their output beams have substantially parallel irradiation directions.

3. The laser device according to claim 1, further including tuning means for tuning the wavelength of said first and second laser diodes within a predetermined wavelength range.

4. The laser device according to claim 3 wherein said tuning means is arranged to tune at least one of said laser diodes.

5. The laser device according to claim 1 wherein said first and second laser diodes are arranged such that a spectral peak of said first laser diode coincides a spectral peak of said second laser diode at said predetermined wavelength.

6. The laser device according to claim 1, further including coupling means for coupling said first and second laser diodes.

7. The laser device according to claim 6 wherein said coupling means includes feedback means having a predetermined feedback spectrum for causing a predetermined amount of energy of said light waves to be fed back to said first and second laser diodes.

8. The laser device according to claim 6 wherein said coupling means includes light path control means for optimizing the light paths of said first and second laser diodes.

9. The laser device according to claim 1, further including waveguide means for propagation of said light waves, said waveguide means comprising at least one waveguide.

10. The laser device according to claim 9 said wherein said waveguide is arranged to be single-mode at said predetermined wavelength.

11. The laser device according to claim 9, further including coupling optics for coupling said light waves into said waveguide.

12. The laser device according to claim 1 wherein at least one of said first and second laser diodes is arranged to have at least one monolithically integrated optical device.

13. The laser device according to claim 1 wherein at least one of said first and second laser diodes is arranged to have a plurality of said light wave generating substructure.

14. A method for combining the output power of two laser diodes, comprising:
   A. providing a semiconductor laser device, said laser device comprising:
      1) a first semiconductor laser diode arranged to emit an output beam at a predetermined wavelength, said diode including:
         a) a top surface with a top electrode,
         b) a light wave generating substructure including a plurality of semiconductor layers disposed below said top surface,
         c) said light wave generating substructure having an active region within 1.5 -micrometer distance of said top electrode;
      2) a second semiconductor laser diode arranged to emit an output beam at a predetermined wavelength, said diode including:
         a) a top surface with a top electrode,
         b) a light wave generating substructure including a plurality of semiconductor layers disposed below said top surface,
         c) said light wave generating substructure having an active region within 1.5 -micrometer distance of said top electrode;
      3) providing bonding and support means for disposing said first and second laser diodes such that their top surfaces are proximate and facing each other; and
   B. combining the output power of said first and second laser diodes.

15. The method according to claim 14 wherein said first and second laser diodes are disposed such that their output beams have substantially parallel irradiation directions.

16. The method according to claim 14, further including a coupling mechanism for coupling said first and second laser diodes.

17. The method according to claim 16 wherein said a coupling mechanism includes a feedback mechanism having a predetermined feedback spectrum for causing a predetermined amount of energy of said light waves to be fed back to said first and second laser diodes.

18. The method according to claim 16 wherein said coupling mechanism includes light path control mechanism for optimizing the light paths of said first and second laser diodes.

19. The method according to claim 14, further including at least one waveguide for propagation of said light waves.

20. The method according to claim 14, further including a tuning mechanism for tuning the wavelength of said first and second laser diodes within a predetermined range.

* * * * *